United States Patent
Funakubo et al.

(10) Patent No.: US 6,773,750 B2
(45) Date of Patent: Aug. 10, 2004

(54) CHEMICAL VAPOR DEPOSITION METHOD AND RELATED MATERIAL

(75) Inventors: Hiroshi Funakubo, Kawasaki (JP); Yasushi Murakami, Nagano-ken (JP); Hideaki Machida, Uenobara-machi (JP)

(73) Assignee: Tri Chemical Laboratory Inc., Yamanashi (JP)

( * ) Notice: Subject to any disclaimer, the term of this patent is extended or adjusted under 35 U.S.C. 154(b) by 0 days.

(21) Appl. No.: 10/422,983

(22) Filed: Apr. 25, 2003

(65) Prior Publication Data

US 2003/0203112 A1 Oct. 30, 2003

Related U.S. Application Data

(62) Division of application No. 09/943,459, filed on Aug. 31, 2001, now abandoned.

(30) Foreign Application Priority Data

Sep. 1, 2000 (JP) ........................................ 2000-265521

(51) Int. Cl.[7] .............................................. C23C 16/00
(52) U.S. Cl. ................ 427/248.1; 427/249.1; 427/250; 427/255.29; 427/255.394
(58) Field of Search .......................... 427/248.1, 249.1, 427/250, 255.29, 255.394

(56) References Cited

U.S. PATENT DOCUMENTS

| | | | | |
|---|---|---|---|---|
| 3,176,050 A | * | 3/1965 | Yun Jen et al. | 525/43 |
| 4,084,020 A | * | 4/1978 | Mathias et al. | 427/487 |
| 4,472,513 A | * | 9/1984 | Menger-Hammond et al. | 502/5 |
| 5,045,354 A | * | 9/1991 | Feimer et al. | 427/245 |
| 5,087,485 A | * | 2/1992 | Cho | 427/253 |
| 5,362,328 A | * | 11/1994 | Gardiner et al. | 118/726 |
| 6,261,954 B1 | * | 7/2001 | Ho et al. | 438/687 |

* cited by examiner

*Primary Examiner*—Bret Chen
(74) *Attorney, Agent, or Firm*—McKenna Long & Aldridge

(57) ABSTRACT

A process for chemical vapor deposition includes depositing a film using a metal β-diketonate complex and an α, β-unsaturated alcohol. The metal β-diketonate complex and the α, β-unsaturated alcohol is contacted on the substrate at the same time, at different times or alternately.

12 Claims, 2 Drawing Sheets

CHEMICAL VAPOR DEPOSITION METHOD AND RELATED MATERIAL

This application is a Division of application Ser. No. 09/943,459, filed on Aug. 31, 2001, now abandoned.

This application claims the benefit of Japanese Patent Application No. 2000-265521, filed Sep. 1, 2000 in Japan, which is hereby incorporated by reference for all purposes as if fully set forth herein.

BACKGROUND OF THE INVENTION

1. Field of the Invention

This invention relates to chemical vapor deposition methods, and more particularly, to materials used in chemical vapor deposition methods as well as films and device elements fabricated using the chemical vapor deposition method.

2. Discussion of the Related Art

Chemical vapor deposition (CVD) is a widely used method to mass-produce metal type films. Materials used in CVD include, for example, silane, arsine, diborane and ammonia, which are gases at room temperature, or is limited to liquids such as tetraetokissilane (TEOS) or trimethylgalium (TMG), which can easily be vaporized.

Recently, the excellent performance of CVD has been recognized and used in many different areas. It has been researched extensively, especially in the semiconductor field. Materials such as transition metal compounds and alkali metal compounds, which have not previously been considered candidate material for use in CVD, are now proposed.

However, the above mentioned transition metal compounds and alkali metal compounds do not have associated organic metals (such as alkyl metals similar to trimethylaluminum) with appropriate vapor pressure. Thus, the use of associated metal complexes, especially the $\beta$-diketone complex, has been proposed for use as a material for CVD.

The proposed metal complexes include for example, $DPM_2Ca$, $DPM_2Sr$, $DPM_2Ba$, $DPM_2Ca$:triene, $DPM_2Sr$:teranene, $DPM_2Ba$:teraene, $DPM_2Pb$:triene, $DPM_3Ru$:triene, $DPM_3Ru$:tetraene, $DPM_2Pb$, $DPM_2(i$-$OPr)2$ Ti, $DPM_3Ru$, $Hfac_2Pt$, $HfacCu$:TMVS, $HfacCu$:ATMS, $HfacCu$:BTMSA, $DPM_4Zr$, $DPM_4Hf$, $DPM_3La$, $DPM_3Bi$.

However, there are problems with these CVD materials. For example, the useful temperature range to form metal films by thermal decomposition of the material near the substrate where the film is to be formed is very narrow.

In addition, low temperature film formation is often required in the manufacture of components that contain semiconductors. When the decomposition temperature is high, the CVD material decomposes at a location far from the substrate on which the film must be formed. Since the reaction does not occur at the substrate surface, the film surface uniformity is then reduced. For example, when a film is deposited on a rough surface with bumps and dips, it may not coat the bottoms of the superficial indentations when the decomposition temperature is high. Even if the film forms, it may not be uniform and may be bumpy. In current semiconductor processes, a design rule of below 0.5 microns is becoming a standard, and it is often difficult or impossible to deposit films that meet this standard when the decomposition temperature is high.

On the other hand, these CVD materials often do not decompose efficiently at low temperatures, so low temperature processes often cannot achieve the required film properties.

SUMMARY OF THE INVENTION

Accordingly, the present invention is directed to a chemical vapor deposition (CVD) method and related materials that substantially obviates one or more of the problems due to limitations and disadvantages of the related art.

An advantage of the present invention is a film fabrication technology that allows the formation of high quality films using CVD of a metal $\beta$-diketonate complex.

Additional features and advantages of the invention will be set forth in the description which follows, and in part will be apparent from the description, or may be learned by practice of the invention. The objectives and other advantages of the invention will be realized and attained by the scheme particularly pointed out in the written description and claims hereof as well as the appended drawings.

To achieve these and other advantages and in accordance with the purpose of the present invention, as embodied and broadly described, a process for chemical vapor deposition comprises depositing a film using a metal $\beta$-diketonate complex and an $\alpha$, $\beta$-unsaturated alcohol.

In another aspect, the present invention includes a process for chemical vapor deposition for forming a film on a substrate comprising contacting a metal $\beta$-diketonate complex and an $\alpha$, $\beta$-unsaturated alcohol at the same time, at different times or alternately on the substrate.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiments of the present invention with reference to the accompanying drawings.

In the drawings.

DETAILED DESCRIPTION OF ILLUSTRATED EMBODIMENTS

Figure 1:
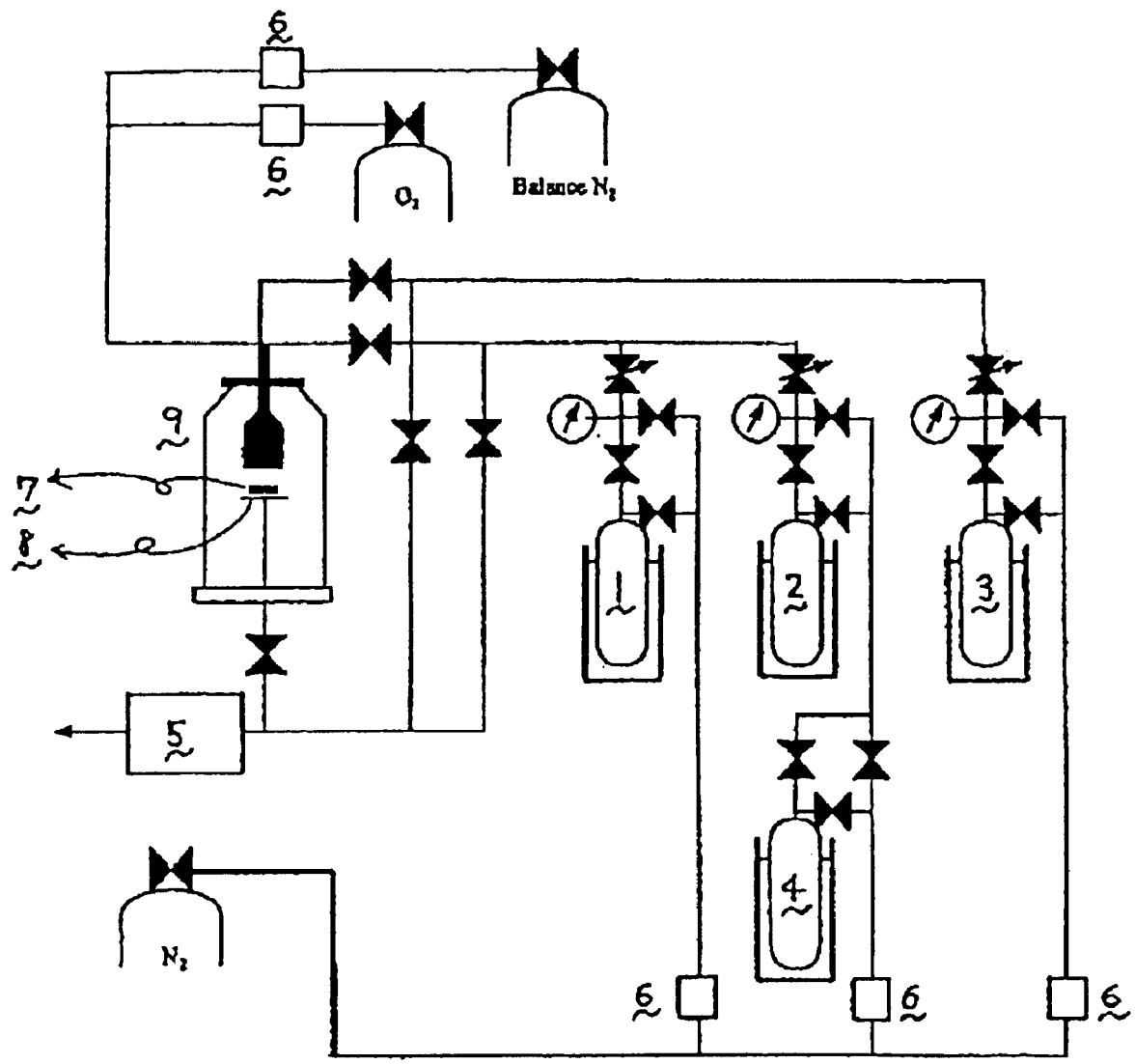
FIG. 1 is a schematic of the chemical vapor deposition system.

Reference will now be made in detail to the preferred embodiments of the present invention, examples of which are illustrated in the accompanying drawings.

The problem described in the prior art above relates to the chemical vapor deposition method. It is solved by a chemical vapor deposition (CVD) method that uses metal $\beta$-diketonate complexes and $\alpha$, $\beta$-unsaturated alcohol. In the CVD method, the metal $\beta$-diketonate complex and $\alpha$, $\beta$-unsaturated alcohol are contacted at the same time, at different times or alternately, on the substrate surface to form a film on the base substrate.

Moreover, a supplemental material for chemical vapor deposition is provided where the supplemental material is the $\alpha$, $\beta$-unsaturated alcohol and the supplemental material is used with a metal $\beta$-diketonate complex during chemical vapor deposition to form a film.

A supplemental material for chemical vapor deposition is provided where the supplemental material is the $\alpha$, $\beta$-unsaturated alcohol and the supplemental material and the metal $\beta$-diketonate complex are contacted at the same time, at different times or alternately, on a base substrate to form a film during chemical vapor deposition.

In other words, if a metal β-diketonate complex is used for CVD to form films, then if α, β-unsaturated alcohol is also used, a high quality film forms even at low substrate (decomposition) temperature. The film thus formed has high step uniformity.

The present invention requires the use of α, β-unsaturated alcohol. Just any alcohol (compound containing OH base) can not be used. It is imperative that α, β-unsaturated alcohol be used. Among such alcohols, the compound expressed in the formula (I) below is described.

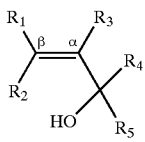

where $R_1$, $R_2$, $R_3$, $R_4$, and $R_5$ are chosen from the base groups X (halogens), H, alkyl bases and silicon type compounds, and each can be the same or different.

It is especially desirable that the α, β-unsaturated alcohol be one or two types chosen from the following: aryl alcohol, crotyl alcohol, cis-2-hexen-1-ol, trans-2-hexen-1-ol, 3-methyl-2-butene-1-ol, 1-butene-3-ol, 1-pentene-3-ol, 1-hexen-3-ol, 3-hexen-2, 5-diol, 2-methyl-3-butene-2-ol, 2, 4-hexadiene-1-ol.

The complex used in the present invention is the metal β-diketonate complex. It is the compound expressed by the formula (II) below.

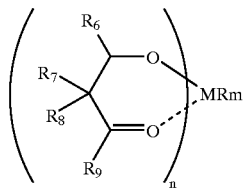

where $R_6$, $R_7$, $R_8$, $R_9$ and R are chosen from the base groups X (halogens), H, alkyl bases, silicon type compounds, and each base can be the same or different; n is an integer from 1–4 and m is an integer from 1–5; and M is a metal.

Specifically, the β-diketone of the metal β-diketonate complex is chosen from a group of chemicals that include acetylacetone, dipivaloylmethane, hexafluoroacetylacetone and trifluoroacetylacetone.

The films obtained in the present invention include metal films, metal oxide films, metal nitride films, or metal carbide films. For example, the film can be any of the following: a compound oxide film containing Ru and Sr; a compound oxide film containing Ti, Ba and Sr; a compound oxide film containing Ti and Bi; a compound oxide film containing Sr or Ta and Bi; a compound oxide film containing Sr, Ta, Nb and Bi; a compound oxide film containing Pb, Zr and Ti; a film containing as the main component Zr, Hf or La; a conductive film containing as a main component Ru, Pt, or Ir; or a conductive film containing Cu as a main component.

Moreover, device elements such as LSI can be obtained from specific processing of the film fabricated from the chemical vapor deposition method described in the present invention.

The chemical vapor deposition method of the present invention includes a chemical vapor deposition method that uses metal β-diketonate complexes and α, β-unsaturated alcohol. Specifically, the chemical vapor deposition method involves contacting the substrate with vaporized metal β-diketonate complex and vaporized α, β-unsaturated alcohol, at the same time, at different times or alternately to form films.

The supplemental material used in the chemical vapor deposition methods of the present invention is a supplemental material used with the metal β-diketonate complex during chemical vapor deposition to form films. This supplemental material is α, β-unsaturated alcohol. In particular, the supplemental material is used so that it contacts the substrate at the same time, at different times or alternately with vaporized metal β-diketonate during chemical vapor deposition to form films. This supplemental material is α, β-unsaturated alcohol.

The α, β-unsaturated alcohol used in the present invention can be any α, β-unsaturated alcohol. However, the compound shown in equation (I) above is preferred. Moreover, one or two different types of the α, β-unsaturated alcohol chosen from the following group is preferred: aryl alcohol ($CH_2=CH-CH_2-OH$), crotyl alcohol ($CH_3CH=CH-CH_2OH$), cis-2-hexen-1-ol ($CH_3CH_2CH_2CH=CH-CH_2OH$), trans-2-hexen-1-ol ($CH_3CH_2CH_2CH=CH-CH_2OH$), 3-methyl-2-butane-1-ol ($CH_3-C(CH_3)=CH-CH_2OH$), 1-butane-3-ol ($CH_2=CH-CH(OH)-CH_3$), 1-pentene-3-ol ($CH_2=CH-CH(OH)-CH_2CH_3$), 1-hexen-3-ol ($CH_2=CH-CH(OH)-CH_2CH_2CH_3$), 3-hexen-2, 5-diol ($CH_3-CH(OH)-CH=CH-CH(OH)-CH_3$), 2-methyl-3-butene-2-ol (($CH_2=CH-C(CH_3)(OH)-CH_3$), 2, 4-hexadiene-1-ol ($CH_3-CH=CH-CH=CH-CH_2OH$).

The complex in the present invention is the metal β-diketonate complex. Among these, the compound shown in equation (II) above is preferred. Specifically, the β-diketone in the metal diketonate complex chosen from the following is preferred: acetylacetone, dipivaloylmethane, hexafluoroacetylacetone, trifluoroacetylacetone.

The films obtained in the present invention are, for example, metal films, metal oxide films, metal nitride films, or metal carbide films. For example, the film can be any of the following: a compound oxide film containing Ru and Sr; a compound oxide film containing Ti, Ba and Sr; a compound oxide film containing Ti and Bi; a compound oxide film containing Sr, Ta and Bi; a compound oxide film containing Sr, Ta, Nb and Bi; compound oxide film containing Pb, Zr and Ti; a film containing as the main component Zr, Hf or La; a conductive film containing as a main component Ru, Pt or Ir; or a conductive film containing Cu as a main component.

Also, device elements such as LSI can be obtained from specific processing of the film fabricated from the chemical vapor deposition method described in the present invention.

In the following, many examples of the present invention will be described and explained.

EXAMPLE 1

FIG. 1 is a schematic of the system used for the chemical vapor deposition method in the present invention.

FIG. 1 shows containers 1, 2, 3 and 4 that can be used as a vaporizer, a vacuum pump 5, gas flow controllers 6, a substrate 7, a heater 8, and a reaction furnace 9. The vacuum pump 5 is connected, via valves, to the reaction furnace 9 and to the containers. The containers 1, 2, 3 and 4 are connected to the reaction furnace 9 through valves. The substrate 7 is over the heater 8 in the reaction furnace 9.

We fabricated Sr films on the substrate that was heated to a set temperature. using the equipment shown in FIG. 1.

To grow the Sr film, $DPM_2Sr$:tetanene was placed in container 2 and heated to 130° C. At the same time, nitrogen gas was supplied at a rate of 100 ml/min, and $DPM_2Sr$:tetanene was vaporized.

Also, at the same time as 1-hexen-3-ol was placed in container 3 and heated to 35° C., nitrogen gas was supplied at a rate of 20 ml/min. As a result, Sr film was formed on the substrate 7.

Figure 2:
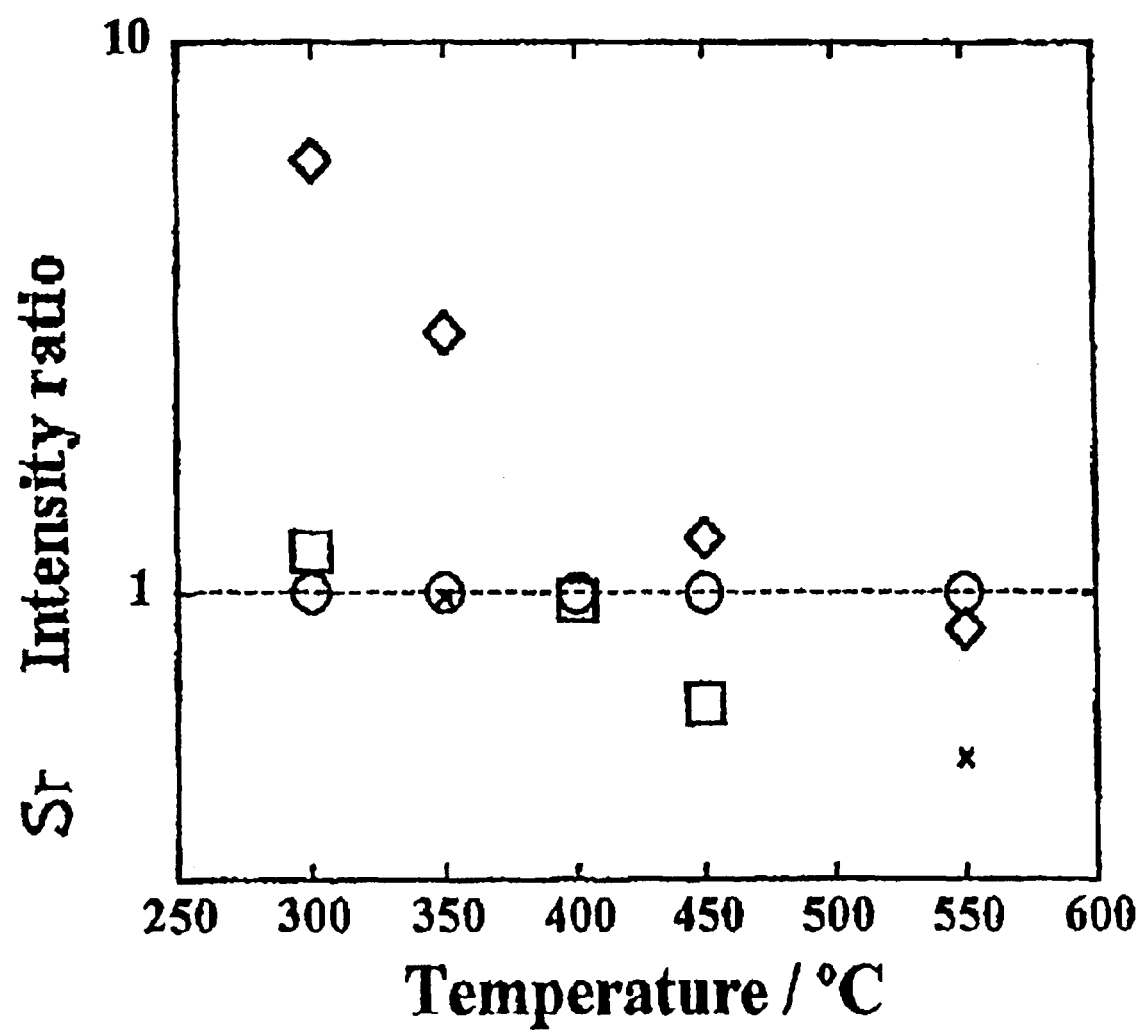
FIG. 2 is a graph depicting the relationship between the intensity output of the elemental analysis system versus the substrate temperature.

This Sr film was measured using x-ray analysis and the data points are shown as diamond-shaped points in FIG. 2. The y-axis is the intensity strength ratio and the x-axis is the substrate temperature (° C.). As a result, as can be seen, satisfactory films can be readily formed at a low substrate temperature of 300–350° C. using CVD.

Comparative Example 1

As a comparative example to Example 1, 1-hexen-3-ol was not used. All other procedures were conducted in the same manner as in example 1 above and an Sr film was formed on the substrate 7. This Sr film was measured using x-rays analysis and the datapoints are shown as circle-shaped points in the graph of FIG. 2.

The results show that the intensity of this Sr film is lower than that of Example 1. In other words, the beneficial action of 1-hexen-3-ol on the decomposition of $DPM_2Sr$:teraene in the lower temperature regime is evident.

Comparative Example 2

As another comparative example, n-propanol was used in place of 1-hexen-3-ol. All other procedures were conducted in the same manner as in Example 1 above and an Sr film was formed on the substrate 7. This Sr film was measured using x-ray analysis and the data points are shown as square-shaped points in the graph of FIG. 2.

The results show that the intensity of this Sr film is lower than that of Example 1. In other words, the low temperature decomposition action of 1-hexen-3-ol on $DPM_2Sr$:teraene is not simply due to the OH base in the alcohol.

Comparative Example 3

In this comparative example, 3-hexanol was used instead of 1-hexen-3-ol. All other procedures were conducted in the same manner as in Example 1 above and an Sr film was formed on the substrate 7. This Sr film was measured using x-ray analysis and is shown as x-shaped points in the graph of FIG. 2.

The results show that the intensity of this Sr film is lower than that of example 1. In other words, despite the fact that the difference between 1-hexen-3-ol and 3-hexanol is merely the presence or absence of double bonds, the low temperature decomposition action of 1-hexen-3-ol on $DPM_2Sr$:teraene is significantly different from that of 3-hexanol on $DPM_2Sr$.

EXAMPLES 2–12

The method described in example 1 was used with two differences. Instead of placing 1-hexen-3-ol in container 3, one of the α, β-unsaturated alcohols listed below was placed in container 3 and heated to 35–130° C. Also, the flow rate of nitrogen gas was changed to 20 ml/min. An Sr film was formed on substrate 7.

Example 2: aryl alcohol ($CH_2=CH-CH_2-OH$)
Example 3: crotyl alcohol ($CH_3CH=CH-CH_2OH$)
Example 4: cis-2-hexen-1-ol ($CH_3CH_2CH_2CH=CH-CH_2OH$)
Example 5: trans-2-hexen-1-ol ($CH_3CH_2CH_2CH=CH-CH_2OH$)
Example 6: 3-methyl-2-butane-1-ol ($CH_3-C(CH_3)=CH-CH_2OH$)
Example 7: 1-butane-3-ol ($CH_2=CH-CH(OH)-CH_3$)
Example 8: 1-pentene-3-ol ($CH_2=CH-CH(OH)-CH_2CH_3$)
Example 9: 1-hexen-3-ol ($CH_2=CH-CH(OH)-CH_2CH_2CH_3$)
Example 10: 3-hexen-2, 5-diol ($CH_3-CH(OH)-CH=CH-CH(OH)-CH_3$)
Example 11: 2-methyl-3-butene-2-ol (($CH_2=CH-C(CH_3)(OH)-CH_3$)
Example 12: 2, 4-hexadiene-1-ol ($CH_3-CH=CH-CH=CH-CH_2OH$)

The results confirm the facilitation action of the decomposition reaction of metal diketonate complex by α, β-unsaturated alcohol in the low temperature regime, at a substrate temperature below 450° C.

EXAMPLES 13–31

The method described in Example 1 was used with the difference that $DPM_2Sr$:teranene was replaced by one of the metal β-diketonate complexes listed below to form a metal film on the surface of substrate 7.

Example 13: $DPM_2Ca$
Example 14: $DPM_2Sr$
Example 15: $DPM_2Ba$
Example 16: $DPM_2Ca$:triene
Example 17: $DPM_2Sr$:teranene
Example 18: $DPM_2Ba$:teraene
Example 19: $DPM_2Pb$:triene
Example 20: $DPM_3Ru$:triene
Example 21: $DPM_3Ru$:tetraene
Example 22: $DPM_2Pb$
Example 23: $DPM_2$ (i-OPr)2 Ti
Example 24: $DPM_3Ru$, $Hfac_2Pt$
Example 25: HfacCu:TMVS
Example 26: HfacCu:ATMS
Example 27: HfacCu:BTMSA
Example 28: $DPM_4Zr$
Example 29: $DPM_4Hf$
Example 30: $DPM_3La$
Example 31: $DPM_3Bi$

EXAMPLE 32

We fabricated compound oxide films containing Sr and Ru on a substrate 7 using the equipment shown in FIG. 1. In this example, $DPM_3Ru$ was place in container 1 and heated to 100° C., while simultaneously, nitrogen gas was supplied at a rate of 100 ml/min, and $DPM_3Ru$ was vaporized. Also, at the same time, $DPM_2Sr$:teranene was place in container 2 and heated to 130° C., while simultaneously, nitrogen gas was supplied at a rate of 100 ml/min, and $DPM_2Sr$:teranene was vaporized. Also, at the same time, 1-hexen-3-ol was placed in container 3 and heated to 35° C., while nitrogen gas was supplied at a rate of 20 ml/mn.

Finally, oxygen gas was supplied to the area in front of the substrate.

As a result, a compound oxide film containing both Ru and Sr ($SrRuO_3$) formed on the substrate 7.

It was possible to set the substrate temperature in the present example lower by 50–100° C. lower than the temperature needed when 1-hexen-3-ol is not used. Even at this low temperature, a good quality oxide film could form.

EXAMPLES 33–34

The method described in Example 32 was used to form oxide films on substrate 7. The materials placed in containers 1, 2, 3 and 4 in each experiment are shown in Table 1 below.

TABLE I

|  | 1 | 2 | 4 | 3 |
|---|---|---|---|---|
| Ba, Sr, Ti, O | DPM2Ba:tetraene | DPM2Sr:tetraene | DPM2Ti(i-o-Pr)2 | 1-pentene-3-ol |
| Bi, Ti, O | DPM3Bi | — | DPM2Ti(i-o-Pr)2 | Crotylalcohol |
| Bi, Ti, O | Me3Bi/Heptane | — | DPM2Ti(i-o-Pr)2 | 1-Hexen-3-ol |
| Sr, Ta, Bi, O | Me3Bi/Heptane | DPM2Sr:tetraene | Ta(OEt)5 | 1-Hexen-3-ol |
| Pb, Zr, Ti, O | Et4Pb | DPM4Zr | Ti(i-o-Pr)4 | 1-Hexen-3-ol |
| Zr, O | — | DPM4Zr | — | 1-Hexen-3-ol |
| Hf, O | — | DPM4Hf | — | 1-Hexen-3-ol |
| La, O | — | DPM3La | — | 1-Hexen-3-ol |
| Si, Zr, O | Si(OEt)4 | DPM4Zr | — | 1-Hexen-3-ol |
| Si, Hf, O | HSi(Net2)3 | DPM4Hf | — | 1-Hexen-3-ol |
| Si, La, O | HSi(Net2)3 | DPM3La | — | 1-Hexen-3-ol |

The substrate temperature in the present example was set 50–100° C. lower than when α, β-unsaturated alcohol is not used. Even at this low temperature, a good quality oxide film can be formed.

EXAMPLES 44–48

In these examples, one of the metal β-diketonate complexes listed below was used instead of DPM$_2$Sr:teraene. All other procedures were conducted in the same manner as in example 1 above. Conductive films were formed on the substrate 7.

| Conductive film | metal β-diketonate complex |
|---|---|
| RuO$_x$ | DPM$_3$Ru |
| Pt | Hfac$_2$Pt |
| IrO$_x$ | Acac$_3$Ir |
| Cu | Hfac$_2$Cu |
| Cu | HfacCu:TMVS |

The substrate temperature in the present example was set 50–100° C. lower than when 1-hexen-3-ol is not used. However, even at this low temperature, a good quality oxide film can be formed.

Accordingly, when forming films with CVD using metal β-diketonate, high quality films can be formed at low temperature. The films also have high degree of step uniformity.

The present invention thus provides at least the following. First, the present invention provides a film technology to form high quality films. Second, the present invention provides a film technology to form films with high step uniformity. Third, the present invention provides a film technology to widen the range of the heat decomposition temperature to form films. Fourth, the present invention provides a film technology to form quality films at low temperature. Fifth, the present invention provides a film technology that will allow the formation of quality films using the metal β-diketonate complex with CVD.

It will be apparent to those skilled in the art that various modifications and variation can be made in the present invention without departing from the split or scope of the invention. Thus, it is intended that the present invention cover the modifications and variations of this invention provided they come within the scope of the appended claims and their equivalents.

What is claimed is:

1. A process for chemical vapor deposition comprising depositing a film using a metal β-diketonate complex and an α, β-unsaturated alcohol.

2. A process for chemical vapor deposition for forming a film on a substrate comprising contacting a metal β-diketonate complex and an α, β-unsaturated alcohol at the same time, at different times or alternately on the substrate.

3. A process for chemical vapor deposition according to any one of claims 1 and 2 wherein the α, β-unsaturated alcohol is a compound characterized as:

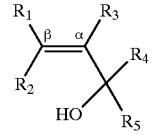

where R$_1$, R$_2$, R$_3$, R$_4$ and R$_5$ are chosen from the base groups X (halogens), H, alkyl bases and silicon type compounds, and each can be the same or different.

4. A process for chemical vapor deposition according to any one of claims 1 and 2 wherein the α, β-unsaturated alcohol is one or two types selected from the group consisting of: aryl alcohol, crotyl alcohol, cis-2-hexen-1-ol, trans-2-hexen-1-ol, 3-methyl-2-butene-1-ol, 1-butene-3-ol, 1-petene-3-ol, 1-hexen-3-ol, 3-hexen-2, 5-dial, 2-methyl-3-butene-2-ol, 2, 4-hexadiene-1-ol.

5. A process for chemical vapor deposition according to any one of claims 1 and 2 wherein the metal β-diketonate complex is a compound characterized as:

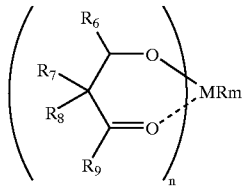

where R$_6$, R$_7$, R$_8$, R$_9$ and R are chosen from the base groups X (halogens), H, alkyl bases and silicon type compounds, and each can be the same or different, n is an integer from 1–4 and m is an integer from 0–5 and M is a metal.

6. A process for chemical vapor deposition according to any one of claims 1 and 2 wherein β-diketone of the metal β-diketonate complex is selected from the group consisting of acetylacetone, dipivaloylmethane, hexafluoroacetylacetone, trifluoroacetylacetone.

7. A process for chemical vapor deposition according to any one of claims 1 and 2 wherein the film includes one of a metal film, a metal oxide film, a metal nitride film, a metal and a metal carbide film.

8. A process for chemical vapor deposition according to claim 5 wherein β-diketone of the metal β-diketonate complex is selected from the group consisting of acetylacetone, dipivaloylmethane, hexafluoroacetylacetone, trifluoroacetylacetone.

9. A process for chemical vapor deposition according to claim 3, wherein the film includes one of a metal film, a metal oxide film, a metal nitride film, a metal and a metal carbide film.

10. A process for chemical vapor deposition according to claim 4, wherein the film includes one of a metal film, a metal oxide film, a metal nitride film, a metal and a metal carbide film.

11. A process for chemical vapor deposition according to claim 5, wherein the film includes one of a metal film, a metal oxide film, a metal nitride film, a metal and a metal carbide film.

12. A process for chemical vapor deposition according to claim 6, wherein the film includes one of a metal film, a metal oxide film, a metal nitride film, a metal and a metal carbide film.

* * * * *